United States Patent
Oono et al.

(10) Patent No.: US 10,527,513 B2
(45) Date of Patent: Jan. 7, 2020

(54) PRESSURE SENSOR WITH RESIN PORTION AND MEMBRANE HAVING REDUCED TEMPERATURE CHANGE DISTORTION

(71) Applicant: DENSO CORPORATION, Kariya, Aichi-pref. (JP)

(72) Inventors: Kazuyuki Oono, Kariya (JP); Kouji Hashimoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 79 days.

(21) Appl. No.: 15/738,431

(22) PCT Filed: Jun. 2, 2016

(86) PCT No.: PCT/JP2016/002679
§ 371 (c)(1),
(2) Date: Dec. 20, 2017

(87) PCT Pub. No.: WO2017/002306
PCT Pub. Date: Jan. 5, 2017

(65) Prior Publication Data
US 2018/0195922 A1   Jul. 12, 2018

(30) Foreign Application Priority Data
Jun. 30, 2015   (JP) .................. 2015-130931

(51) Int. Cl.
*G01L 9/06* (2006.01)
*H01L 29/84* (2006.01)
(Continued)

(52) U.S. Cl.
CPC ............ *G01L 9/065* (2013.01); *G01L 9/0052* (2013.01); *G01L 19/0069* (2013.01);
(Continued)

(58) Field of Classification Search
USPC .................................................. 73/700–756
See application file for complete search history.

(56) References Cited

U.S. PATENT DOCUMENTS 5,207,102 A * 5/1993 Takahashi ........... G01L 19/0084
29/621.1
2009/0230487 A1 * 9/2009 Saitoh ................... B81B 7/0061
257/419
(Continued)

FOREIGN PATENT DOCUMENTS

JP   2010-085307 A   4/2010
JP   2014-102225 A   6/2014

*Primary Examiner* — Andre J Allen
(74) *Attorney, Agent, or Firm* — Posz Law Group, PLC

(57) ABSTRACT

A pressure sensor includes a sensor chip and a resin portion. The sensor chip extends in a lengthwise direction and includes a membrane whose length in a thickness direction perpendicular to the lengthwise direction is smaller than another part, and a piezoelectric element provided in the membrane. The sensor chip includes a fixed end that is covered with and fixed to the resin portion, and a free end opposite from the fixed end in the lengthwise direction. The free end is spaced away from the resin portion in the lengthwise direction, and the membrane is located in the free end. A shortest separation distance between the membrane and a part of the resin portion covering the sensor chip is equal to or larger than a length of the sensor chip along a crosswise direction of the sensor chip perpendicular to both the lengthwise direction and the thickness direction.

8 Claims, 5 Drawing Sheets

(51) Int. Cl.
*G01L 9/00* (2006.01)
*G01L 19/00* (2006.01)
*G01L 19/14* (2006.01)
*H01L 41/113* (2006.01)

(52) U.S. Cl.
CPC ............ *G01L 19/147* (2013.01); *H01L 29/84* (2013.01); *H01L 41/1136* (2013.01)

(56) References Cited

U.S. PATENT DOCUMENTS

2009/0266173 A1* 10/2009 Kobayashi ............ G01L 9/0075
73/724
2013/0307094 A1* 11/2013 Yoshiuchi .......... G01C 19/5783
257/415
2018/0277736 A1* 9/2018 Tsukahara ............ B41J 2/14233

* cited by examiner

L/w=0.4
P=8.9

L/w=0.6
P=4.7

L/w=0.8
P=1.6

L/w=1.0
P=0.0

PRESSURE SENSOR WITH RESIN PORTION AND MEMBRANE HAVING REDUCED TEMPERATURE CHANGE DISTORTION

CROSS REFERENCE TO RELATED APPLICATIONS

This application is a U.S. national phase of International Application No. PCT/JP2016/002679 filed on Jun. 2, 2016 and is based on and incorporates herein by reference Japanese Patent Application No. 2015-130931 filed on Jun. 30, 2015.

TECHNICAL FIELD

The present disclosure relates to a pressure sensor in which a sensor chip having a piezoelectric element in a membrane is supported by a resin portion to be cantilevered.

BACKGROUND ART

As shown in Patent Document 1, a physical quantity sensor that includes a sensor chip and a sealing member is known. The sensor chip includes a sensing portion that outputs a sensing signal based on a physical quantity. The sealing member supports the sensor chip as a cantilever, such that a part of the sensor chip is sealed by the sealing member and the sensing portion is exposed from the sealing member.

PRIOR ART DOCUMENT

Patent Document

Patent Document 1: JP 2014-102225

SUMMARY OF THE INVENTION

The sensor chip disclosed in Patent Document 1 extends in a lengthwise direction, and one end of the sensor chip is covered with the sealing member. The sensing portion is provided on the other end of the sensor chip. When the temperature changes, the sealing member expands or shrinks, and accordingly the sensor chip is distorted by the thermal stress. The distortion decreases depending on the distance from the sealing member. Accordingly, when the sensor chip is long and the sensing portion is distant from the sealing member, the distortion can be limited from reaching the sensing portion. According to this, a decrease of accuracy in detecting a physical quantity can be limited.

However, when the sensor chip is excessively long, the size of the sensor chip may excessively increase. In contrast, when the sensor chip is excessively short, the distortion may not be limited adequately from reaching the sensing portion, and accordingly the decrease of accuracy in detecting a physical quantity may not be effectively limited.

In consideration of the above-described points, it is an objective of the present disclosure to provide a pressure sensor in which both an increase of size of a sensor chip and a decrease of accuracy in detecting a physical quantity (pressure) are limited.

According to an aspect of the present disclosure, a pressure sensor includes a sensor chip and a resin portion. The sensor chip extends in a lengthwise direction and includes a membrane whose length in a thickness direction perpendicular to the lengthwise direction is smaller than another part, and a piezoelectric element provided in the membrane. The resin portion supports the sensor chip to be cantilevered. The sensor chip includes two end portions. One of the two end portions is a fixed end that is covered with and fixed to the resin portion, and another of the two end portions is a free end opposite from the fixed end in the lengthwise direction. The free end is spaced away from the resin portion in the lengthwise direction, and the membrane is located in the free end that is spaced away from the resin portion. A shortest separation distance between the membrane and a part of the resin portion covering the sensor chip is equal to or larger than a length of the sensor chip along a crosswise direction of the sensor chip perpendicular to both the lengthwise direction and the thickness direction.

When the separation distance is equal to or larger than the length (width) of the sensor chip in the crosswise direction, the distortion due to a temperature change may be unlikely to occur in the membrane. Accordingly, a decrease of accuracy in detecting pressure due to the temperature change can be limited.

Further, a relationship between the width and the separation direction, at which the distortion due to the temperature change is unlikely to occur in the membrane, is specified. Therefore, a region of the sensor chip covered with the resin portion can be determined based on this relationship, and accordingly the distortion in the membrane can be limited without making the sensor chip excessively long. Accordingly, the increase of the size of the sensor chip can be limited while the distortion of the membrane is limited.

EMBODIMENTS FOR EXPLOITATION OF THE INVENTION

Figure 1:
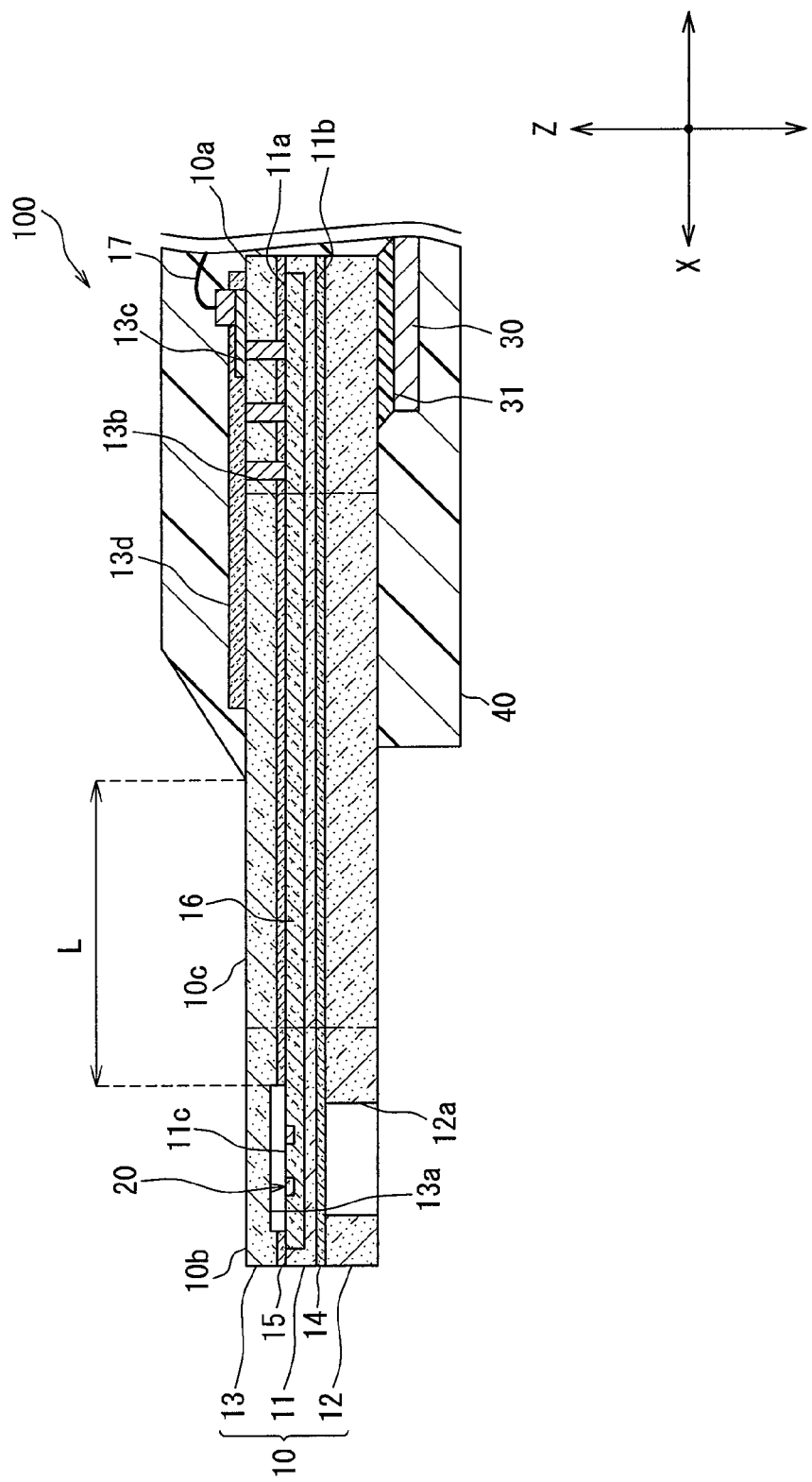
FIG. 1 is a cross-sectional diagram illustrating a pressure sensor.

Hereinafter, multiple embodiments for implementing the present disclosure will be described referring to drawings. In the respective embodiments, a part that corresponds to a matter described in a preceding embodiment may be assigned the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

Hereinafter, an embodiment in which the present disclosure is used for detecting a pressure of an engine oil is described below referring to drawings.

(First Embodiment)

Figure 2:
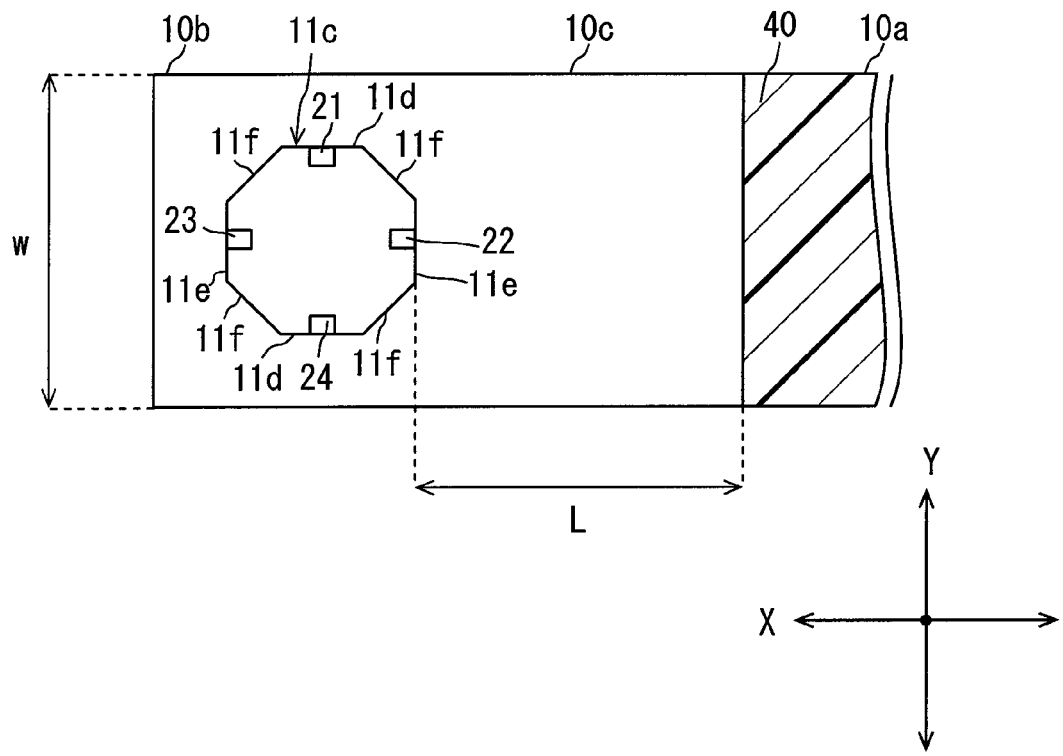
FIG. 2 is a top view of the pressure sensor.

A pressure sensor according to the present embodiment is described below with reference to FIGS. 1 to 5. In FIG. 1, a boundary between a fixed end 10a and a center part 10c of a sensor chip 10, and a boundary between a free end 10b and the center part 10c are indicated by dash-dotted lines in order to clearly show the boundaries. The fixed end 10a and the free end 10b are linked with each other through the center part 10c. In FIG. 2, a resin portion 40 is indicated by hatching in order to clarify the structure.

Hereinafter, three directions which are perpendicular to each other are an x-direction, a y-direction, and a z-direction. The x-direction corresponds to a lengthwise direction of the sensor chip 10, the y-direction corresponds to a crosswise direction of the sensor chip 10, and the z-direction corresponds to a thickness direction of the sensor chip 10.

A pressure sensor 100 detects a pressure of engine oil. The engine oil flows through pipes. The oil pressure dynamically fluctuates and is exerted on the pressure sensor 100. The pressure sensor 100 detects an oil temperature as well as the oil pressure. The detections of the oil pressure and the oil temperature are described later.

As shown in FIG. 1, the pressure sensor 100 includes the sensor chip 10, an inner lead 30, and the resin portion 40. The sensor chip 10 has a cuboid shape extending in the x-direction, and the fixed end 10a is supported by the inner lead 30 through an adhesive 31. A part of the sensor chip 10 connected with the inner lead 30 and a part of the center part 10c of the sensor chip 10 are covered with the resin portion 40. According to this configuration, the sensor chip 10 is cantilevered by the inner lead 30 and the resin portion 40, and an end of the sensor chip 10 opposite from the fixed end 10a is the free end 10b.

The sensor chip 10 is formed, in a vacuum chamber, by directly bonding together three substrates 11-13 which extend in the x-direction. A third substrate 13 is directly bonded to one side (first side) 11a of a first substrate 11, and a second substrate 12 is directly bonded to the reverse side (second side) 11b of the first substrate 11. The substrates 11-13 are made of silicon, and silicon oxide 14, 15 is formed on an interface between the substrates 11 and 12, and an interface between the substrates 11 and 13.

As shown in FIG. 1, a p-type diffusion layer 16 is formed as a top layer of the one side 11a of the first substrate 11. The p-type diffusion layer 16 includes a wiring pattern and a piezoelectric element 20. A through-hole 12a that extends through the second substrate 12 in the z-direction is formed in a free end 10b side of the second substrate 12. A recess portion 13a in which the third substrate 13 is partially recessed in the z-direction is formed in a free end 10b side of the third substrate 13, and a penetrating electrode 13b extending through the third substrate 13 in the z-direction is provided in a fixed end 10a side of the third substrate 13.

When the substrates 11-13 are directly bonded to each other as described above, the third substrate 13 is directly bonded to the one side 11a such that a formation region of the one side 11a in which the piezoelectric element 20 is formed is surrounded (covered) by the recess portion 13a. According to this, a closed space is defined by the recess portion 13a and the formation region in which the piezoelectric element 20 is formed. The closed space is in a vacuum condition. The second substrate 12 is directly bonded to the reverse side 11b such that a projected region of the reverse side 11b to which the formation region of the piezoelectric element 20 is projected in the z-direction is exposed to an outside through the through-hole 12a.

Accordingly, the recess portion 13a, the formation region of the piezoelectric element 20, the through-hole 12a are aligned along the z-direction, and the sensor chip 10 is partially thin at the formation region of the piezoelectric element 20. The reverse side 11b of this partially thin part (hereinafter, referred to as a membrane 11c) contacts the engine oil. The membrane 11c is distorted according to the fluctuation of the oil pressure. The projected region on the reverse side 11b may contact the engine oil.

The third substrate 13 may be directly bonded to a SOI substrate which is formed by connecting together the first substrate 11 and the second substrate 12 through a silicon oxide 14, instead of directly bonding all separated substrates 11-13 to each other as described above. In this case, the p-type diffusion layer 16 and the through-hole 12a that does not extend through the SOI substrate are provided in the SOI substrate, and the recess portion 13a and the penetrating electrode 13b are provided in the third substrate 13. Subsequently, the SOI substrate and the third substrate 13 are bonded to each other in a vacuum chamber. By this means, the sensor chip 10 is provided.

As described above, the wiring pattern is formed in the first substrate 11. The wiring pattern is electrically connected with the penetrating electrode 13b of the third substrate 13. The penetrating electrode 13b is electrically connected with a wiring 13c provided on a surface of the third substrate 13, and the wiring 13c is connected with a wire 17. The wire 17 is electrically connected with a processing circuit. The wiring 13c is made of aluminum, for example, and the wiring 13c is covered with and protected by a silicon nitride 13d. A part of the wiring 13c connected to the wire 17 is exposed from the silicon nitride 13d.

As shown in FIG. 2, the membrane 11c has an octagonal shape. The shape of the membrane 11c is defined as a shape of an opening end of the through-hole 12a. In the shape of the membrane 11c, two first sides 11d extending along the x-direction, two second sides 11e extending along the y-direction, and four third sides 11f inclined from the x-direction and the y-direction are linked with each other. Two first sides 11d are aligned in the y-direction, and two second sides 11e are aligned in the x-direction. The first sides 11d and the second sides 11e are linked with each other through the third sides 11f. In the present embodiment, the membrane 11c has a regular octagonal shape. Therefore, the lengths of all of the sides 11d-11f are the same.

A center part of each of the three kinds of sides 11d-11f defining the shape of the membrane 11c is the easiest to be distorted in each side. Linked parts (corner) of two sides are the most unlikely to be distorted.

The reverse side 11b of the membrane 11c is exposed to the outside as described above, and the one side 11a of the membrane 11c defines the vacuum closed space together with the recess portion 13a. Accordingly, even when the oil pressure does not dynamically fluctuate, the membrane 11c is normally curved toward the closed space in the z-direction. The membrane 11c is curved such that a center part of the membrane 11c is convex to the closed space. Accordingly, the membrane 11c is curved so as to extend around a center axis including a center point of the membrane 11c and extending along the z-direction. A rim portion (around the sides 11d-11f) of the membrane 11c is curved so as to shrink in a radial direction radially extending from the center point of the membrane 11c. When the oil pressure increases, the membrane 11c is further curved in the z-direction as described above.

As shown in FIG. 2, the membrane 11c includes four piezoresistive effect elements 21-24 as the piezoelectric element 20. The four piezoresistive effect elements 21-24 have the same rate of change of resistance to the distortion of the membrane 11c. The piezoresistive effect elements 21-24 are provided at each center part of the sides 11d and 11e that are the easiest to be distorted in the respective side 11d, 11e. In more detail, the piezoresistive effect elements 21, 24 are provided at the center parts of the first sides 11d and aligned in the y-direction. The piezoresistive effect elements 22, 23 are provided at the center parts of the second sides 11e and aligned in the x-direction.

The four piezoresistive effect elements 21-24 are arranged tortuously in the x-direction, and totally, electricity flows in the x-direction. Accordingly, the resistance of each of the piezoresistive effect elements 21-24 changes when the membrane 11c is extended or shrunk in the x-direction. The change of the resistance when the membrane 11c is shrunk is opposite from that when the membrane 11c is extended.

The piezoresistive effect elements 21, 24 are provided along the first sides 11d. The piezoresistive effect elements 21, 24 may extend along a tangent direction of the center axis of the membrane 11c extending along the x-direction. Accordingly, when the membrane 11c is curved in the z-direction as described above, the piezoresistive effect elements 21, 24 are extended about the center axis of the membrane 11c.

In contrast, the piezoresistive effect elements 22, 23 extend to be perpendicular to the second sides 11e. The piezoresistive effect elements 21, 24 may be provided on an imaginary line of the radial direction extending along the x-direction. Accordingly, when the membrane 11c is curved in the z-direction as described above, the piezoresistive effect elements 22, 23 are shrunk in the radial direction.

As described above, when the membrane 11c is distorted in the z-direction, the piezoresistive effect elements 21, 24 is extended while the piezoresistive effect elements 22, 23 are shrunk. Accordingly, the change of the resistance of the piezoresistive effect elements 21, 24 is opposite from that of the piezoresistive effect elements 22, 23. For example, when the resistance values of the piezoresistive effect elements 21, 24 increase, that of the piezoresistive effect elements 22, 23 decrease.

Figure 3:
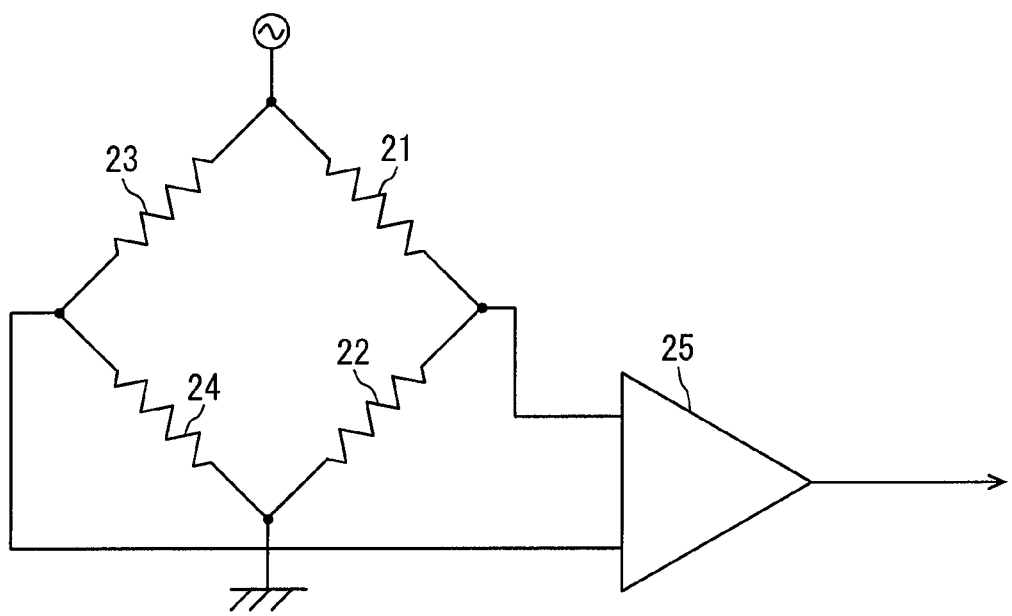
FIG. 3 is a circuit diagram illustrating a full-bridge circuit and a differential amplifier.

As shown in FIG. 3, four piezoresistive effect elements 21-24 constitute two half-bridge circuits, and two half-bridge circuits are linked to constitute a full-bridge circuit. In more detail, the piezoresistive effect elements 21 and 22, whose changes of resistance are opposite from each other, are connected in series with a constant current circuit and a ground to constitute a first half-bridge circuit. The piezoresistive effect elements 23 and 24, whose changes of resistance are opposite from each other, are connected in series with the constant current circuit and the ground to constitute a second half-bridge circuit. The two half-bridge circuit, the constant current circuit, and the ground integrally constitute one full-bridge circuit. According to the above-described configurations, a total resistance of the full-bridge circuit is unlikely to be changed by the distortion of the membrane 11c. The total resistance fluctuates mainly depending on the oil temperature. However, midpoint voltages of the two half-bridges fluctuate depending on the distortion of the membrane 11c.

A midpoint of the first half-bridge circuit (midpoint between the piezoresistive effect elements 21, 22) and a midpoint of the second half-bridge circuit (midpoint between the piezoresistive effect elements 23, 24) are connected to an input terminal of a differential amplifier 25. Accordingly, a difference between the midpoint voltages of the two half-bridge circuits is amplified by the differential amplifier 25, and an electric signal corresponding to the distortion of the membrane 11c is output. The electric signal may correspond to the oil pressure.

The constant current circuit and the differential amplifier 25 are included in the processing circuit. Each of the piezoresistive effect elements 21-24 is electrically connected with the constant current circuit and the differential amplifier 25 through the wiring pattern of the first substrate 11, the penetrating electrode 13d, the wiring 13c, and the wire 17.

The constant current circuit supplies constant current regardless of a change of the total resistance of the full-bridge circuit. The total resistance of the full-bridge circuit is unlikely to be changed by the distortion of the membrane 11c, but the total resistance fluctuates according to the oil temperature. Therefore, the oil temperature can be detected based on a change of the voltage that is generated by the constant current circuit so as to flow the constant current. This process is performed by the processing circuit.

As shown in FIG. 1, the penetrating electrode 13b, the wiring 13c, and the wire 17 are formed in the fixed end 10a of the sensor chip 10. The adhesive 31 is applied to a surface of the sensor chip 10 opposite from the surface on which the wiring 13c is provided, and the sensor chip 10 is physically connected to the inner lead 30 through the adhesive 31. Whole part of the fixed end 10a and a part of the center part 10c are covered with the resin portion 40, and a rest part of the center part 10c and whole part of the free end 10b are exposed from the resin portion 40 to an outside.

The resin portion 40 is an epoxy resin, and the adhesive 31 contains an epoxy resin. After the sensor chip 10 is fixed to the inner lead 30 through the adhesive 31, the sensor chip 10 is put in a mold. Next, melted resin portion 40 is poured into a cavity of the mold, and accordingly the adhesive 31 and the inner lead 30 as well as the fixed end 10a and a part of the center part 10c are covered with the resin portion 40. Subsequently, the mold is cooled to be a predetermined temperature such that the resin portion 40 is solidified. According to this, the pressure sensor 100 is manufactured.

When an ambient temperature changes, the sensor chip 10 and the resin portion 40 of the pressure sensor 100 may expand or contract. Linear expansion coefficients of the sensor chip 10 and the resin portion 40 are different from each other. Therefore, when the ambient temperature changes, a thermal stress due to the difference of the linear expansion coefficients is exerted on the sensor chip 10 and the resin portion 40. The thermal stress is exerted on the fixed end 10a and a part of the center part 10c of the sensor chip 10 which are covered by the resin portion 40. Consequently, the fixed end 10a and a part of the center part 10c are distorted, and the distortion may be transferred to the membrane 11c of the free end 10b through the center part 10c that is exposed from the resin portion 40. Accordingly, the resistance values of the piezoresistive effect elements 21-24 may change, and the electric signal (sensor signal) output from the differential amplifier 25 may change. As described above, the thermal stress may cause the distortion of the membrane 11c, and accordingly the sensor signal may change. That is, a detection accuracy of the pressure may decrease.

The distortion of the membrane 11c due to the thermal stress becomes large as the ambient temperature decreases. The fixed end 10a and a part of the center part 10c is distorted directly by the thermal stress, and the membrane 11c of the free end 10b, which is distant in the x-direction from the directly distorted part, is indirectly distorted through the center part 10c exposed from the resin portion 40. The distortion of the sensor chip 10 due to the thermal stress is reduced from the fixed end 10a toward the free end 10b. Accordingly, the distortion of the membrane 11c can be unlikely to occur by setting a separation distance L between the membrane 11c and a part of the sensor chip 10 covered with the resin portion to be long.

In the pressure sensor 100, the shortest separation distance L in the x-direction between the membrane 11c and a part of the sensor chip 10 covered with the resin portion 40 is longer than a length (width w) of the sensor chip 10 in the y-direction, as shown in FIGS. 1 and 2.

In FIGS. 4A to 4D, the distortions of the membrane 11c occurring when the pressure sensor 100 is cooled to be negative 40 degrees Celsius are shown. Tighter hatching represents larger distortion in the x-direction. Symbols "+" and "−" represent a difference of a distortion direction in the x-direction. The symbol "+" represents a direction in which the membrane 11c approaches the fixed end 10a, and the symbol "−" represents an opposite direction.

Accordingly, a part hatched with "+" hatching (diagonal line) is pulled toward the fixed end 10a that is supported by the resin portion 40. That is, "+" hatchings represent that the sensor chip 10 is compressed. In contrast, a part hatched with "−" hatching is stretched toward a direction away from the fixed end 10a that is supported by the resin portion 40. That is, "−" hatchings (dot) represent that the sensor chip 10 is stretched.

Figure 4A:
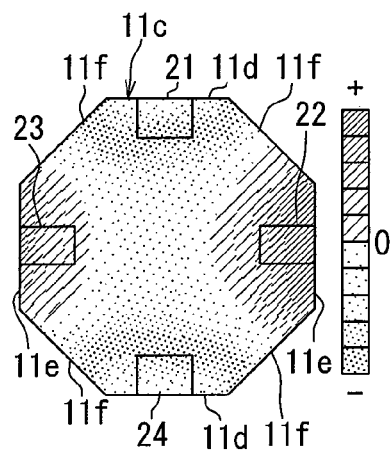
FIG. 4A is a diagram illustrating a relationship between a distortion of a membrane and a ratio L/w.
Figure 4B:
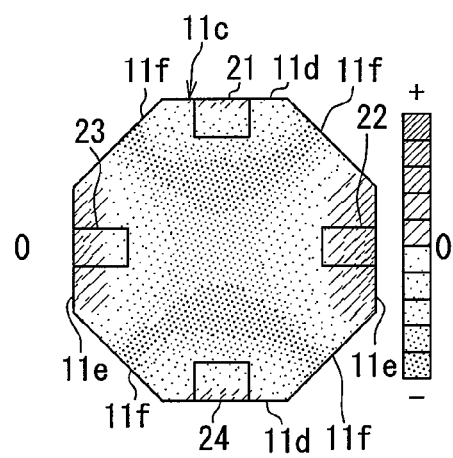
FIG. 4B is a diagram illustrating a relationship between the distortion of the membrane and the ratio L/w.
Figure 4C:
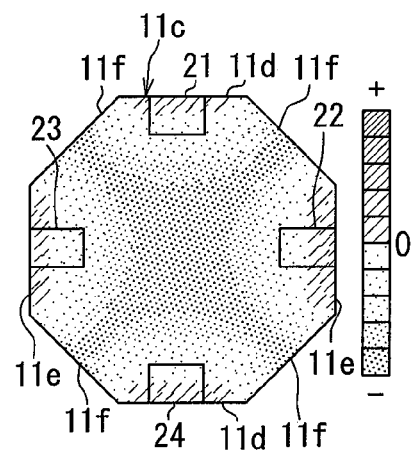
FIG. 4C is a diagram illustrating a relationship between the distortion of the membrane and the ratio L/w.
Figure 4D:
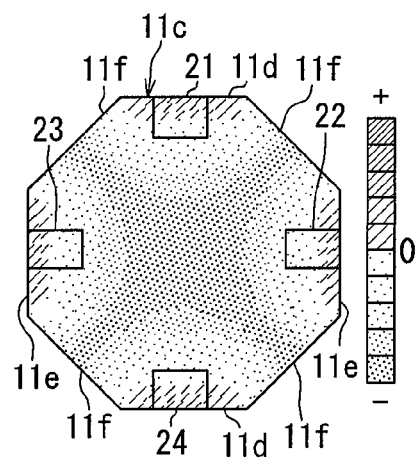
FIG. 4D is a diagram illustrating a relationship between the distortion of the membrane and the ratio L/w.

Results of four experiments are shown in FIGS. 4A to 4D. Among FIGS. 4A to 4D, a ratio L/w that is a ratio of the separation distance L to the width w is different from each other. FIG. 4A shows the distortion of the membrane 11c when the ratio L/w=0.4. FIG. 4B shows the distortion of the membrane 11c when the ratio L/w=0.6. FIG. 4C shows the distortion of the membrane 11c when the ratio L/w=0.8. FIG. 4D shows the distortion of the membrane 11c when the ratio L/w=1.0.

When the ratio L/w is between 0.4 and 0.8, the separation distance L is smaller than the width w, and accordingly the membrane 11c is distorted due to the thermal stress. Consequently, the sensor signal is affected. This is caused by a difference, among the piezoresistive effect elements 21 to 24, of amount and direction of the distortion due to the thermal stress.

In contrast, when the ratio L/w=1.0, the separation direction L is equal to the width w, and accordingly the membrane 11c is unlikely to be distorted by the thermal stress. Consequently, the sensor signal is unlikely to be affected. In this case, the distortion in the piezoresistive effect elements 21 to 24 is caused only by being pulled toward the vacuum closed space, and the distortion in the x-direction due to the thermal stress does not occur. That is, the amount of distortion in the piezoresistive effect elements 21 to 24 is the same as each other.

Values P shown in FIGS. 4A to 4D represent a pressure amount calculated based on a sensor signal, and its unit is an arbitrary unit. When the ratio L/w is between 0.4 and 0.8, the pressure P is between 8.9 and 1.6. In contrast, when the ratio L/w=1.0, the pressure P=0.0. When the ratio L/w=0.4, the pressure P=8.9. When the ratio L/w=0.6, the pressure P=4.7. When the ratio L/w=0.8, the pressure P=1.6.

Figure 5:
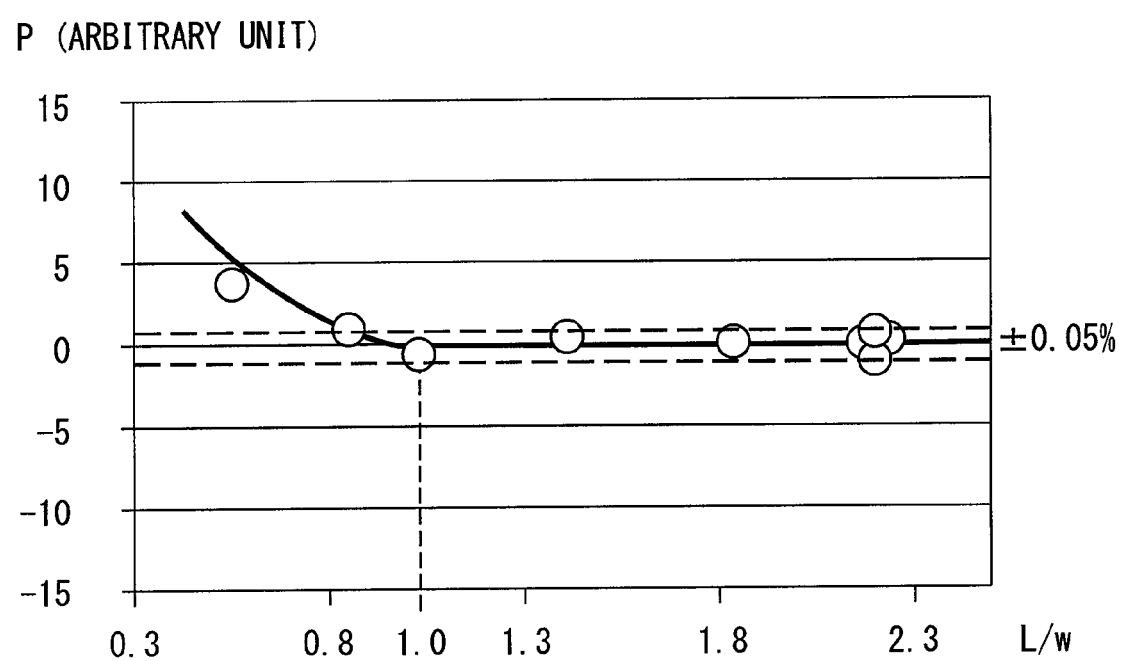
FIG. 5 is a graph illustrating a relationship between the distortion of the membrane and the ratio L/w.

FIG. 5 shows a relationship between the pressure P and the ratio L/w. The solid line shown in FIG. 5 represents results of simulations, and white circles represent results of experiments. As shown in FIG. 5, the larger the ratio L/w is, the smaller the pressure P is. When the ratio L/w is larger than 0.8, the pressure P is equal to or smaller than 0.05% of detection target pressure (detection target pressure order). When the ratio L/w is larger than 1.0, the pressure is approximately zero. As shown in FIG. 5, when the ratio L/w is between 1.0 and 2.3, the pressure P is approximately zero. Dotted lines shown in FIG. 5 may indicate a range in which the pressure P is between 0.05% and −0.05% of the detection target pressure.

The detection target pressure means a pressure (order of pressure) of a detection target medium (engine oil). Accordingly, when the pressure (order of pressure) is 1000 kPa, for example, 0.05% of the pressure means 0.5 kPa. 0.05% is a value set for securing detection accuracy, and the value can be changed depending on the detection accuracy set by a designer.

Nest, effects of the pressure sensor 100 according to the present embodiment will be described. The separation distance L is equal to or larger than the width w. Accordingly, the distortion of the membrane 11c due to thermal stress (temperature change) is unlikely to occur, and a decrease of accuracy in detecting the pressure can be limited.

As shown in FIG. 5, the simulations and the experiments by the inventors reveal the relationship between the width w and the separation distance L, at which the distortion of the membrane 11c due to the temperature change is unlikely to occur. Therefore, when the region in which the sensor chip 10 is covered with the resin portion 40 is set based on FIG. 5, the size increase of the sensor chip 10 can be limited while the distortion of the membrane 11c due to the temperature change can be limited.

As described above, the distortion of the membrane 11c due to thermal stress can be limited without making the sensor chip 10 extremely long in the x-direction. Accordingly, Vibrations of the sensor chip 10, whose center is the fixed end 10a, in response to vibrations of a vehicle can be limited. Excess stress on the sensor chip 10 due to the oil pressure that is exerted dynamically on the free end 10b of the sensor chip 10 can be limited. Accordingly, a decrease of durability of the sensor chip 10 can be limited.

When the inventors have manufactured the sensor chip by anodic bonding of a glass seat to the SOI substrate in which the membrane is provided, the stiffness of the sensor chip is secured, and accordingly distortion of the membrane 11c due to the thermal stress is unlikely to occur. In contrast, when the sensor chip 10 is manufactured by directly bonding the substrates 11-13 made of silicon as described in the present embodiment, the stiffness is not secured, and accordingly the membrane 11c may be distorted depending on the ratio L/w. In the present embodiment, the ratio L/w is set to be equal to or larger than 1.0 such that the membrane 11c is unlikely to be distorted even when the stiffness of the sensor chip 10 is not secured.

The glass seat is used for securing stiffness of the sensor chip, but a special glass is needed for manufacturing the glass seat. In contrast, according to the present disclosure, the distortion of the membrane 11c can be limited without securing stiffness of the sensor chip 10. Accordingly, the sensor chip 10 can be manufactured with a silicon substrate that is cheaper than the glass seat made of special glass. Accordingly, the cost for the sensor chip 10 can be saved while the distortion of the membrane 11c due to thermal stress can be limited.

Although the present disclosure has been fully described, the present disclosure is not limited to the above-described embodiment, and it is to be noted that various changes and modifications will become apparent to those skilled in the art.

In the embodiment of the present disclosure, the pressure sensor 100 detects the engine oil pressure. However, the detection target of the pressure sensor 100 is not limited to the engine oil, and the pressure sensor 100 may detect a hydraulic pressure of transmission. The detection target is not limited to liquid such as oil, but gas such as air can be the detection target.

In the embodiment of the present disclosure, the piezoresistive effect elements 21 to 24 are located at the center part of each of sides 11d and 11e. In detail, four piezoresistive effect elements 21 to 24 are arranged such that the arrangement is restored when the arrangement is rotated by 90 degrees about an center axis of the membrane 11c extending along the z-direction. However, the arrangement of four piezoresistive effect elements 21 to 24 are not limited to this example.

As shown in FIG. 4D, when the membrane 11c is not distorted by thermal stress, the membrane 11c is distorted only by being pulled in the z-direction toward the closed vacuum space. The distribution of the distortion depends on the shape of the membrane 11c. When the membrane 11c has a regular octagon shape as described in the present embodiment, the distribution of the distortion has 4-fold rotational symmetry with respect to the center axis of the regular octagon shape. When θ degrees rotation, with respect to the center axis of the membrane 11c, of the distribution of the distortion of the membrane 11c caused by being pulled in the z-direction toward the closed space results in an identical distribution, the piezoresistive effect elements 21 to 24 may be arranged such that θ degrees ×n (n=natural number) rotation results in an identical arrangement.

In the embodiment of the present disclosure, the membrane 11c has regular octagon shape. However, the shape of the membrane 11c is not limited to this, and square or parallelogram may be used, for example. In this case, four piezoresistive effect elements 21 to 24 are located at center part of respective side constituting the shape of the membrane 11c.

In the present embodiment, the piezoelectric element 20 includes four piezoresistive effect elements 21 to 24, and the piezoresistive effect elements 21 to 24 constitute the full-bridge circuit. However, the piezoelectric element 20 may include only two piezoresistive effect elements 21, 22, and the piezoresistive effect elements 21, 22 may constitute only the first half-bridge circuit.

In the embodiment of the present disclosure, the processing circuit is provided separately from the sensor chip 10. However, the sensor chip 10 may include the processing circuit.

Although the present disclosure has been fully described in connection with the preferred embodiments thereof, it is to be noted that various changes and modifications will become apparent to those skilled in the art. Moreover, other combinations and configurations, including more, less or only a single element, are also within the spirit and scope of the present disclosure.

The invention claimed is:

1. A pressure sensor comprising:
a sensor chip that extends in a lengthwise direction and includes
a membrane whose length in a thickness direction perpendicular to the lengthwise direction is smaller than another part, and
a piezoelectric element provided in the membrane; and
a resin portion that supports the sensor chip to be cantilevered, wherein
the sensor chip includes two end portions,
one of the two end portions is a fixed end that is covered with and fixed to the resin portion,
another of the two end portions is a free end opposite from the fixed end in the lengthwise direction,
the free end is spaced away from the resin portion in the lengthwise direction,
the membrane is located in the free end that is spaced away from the resin portion,
a shortest separation distance between the membrane and a part of the resin portion covering the sensor chip is equal to or larger than a length of the sensor chip along a crosswise direction of the sensor chip perpendicular to both the lengthwise direction and the thickness direction.

2. The pressure sensor according to claim 1, wherein
the sensor chip includes
a first substrate that includes the piezoelectric element on a first side,
a second substrate that includes a through-hole, and
a third substrate that includes a recess portion that surrounds the piezoelectric element,
the second substrate is directly connected to a second side of the first substrate that is a reverse side of the first side,
the first substrate includes
a forming region of the first side in which the piezoelectric element is provided, and
a projecting region obtained by projecting the forming region to the second side,
the projecting region is exposed to an outside through the through-hole,
the third substrate is directly connected to the first side of the first substrate, and
the forming region of the first substrate is surrounded by the recess portion of the third substrate.

3. The pressure sensor according to claim 2, wherein
the membrane includes two surfaces opposing to each other in the thickness direction,
one of the two surfaces corresponds to a part of the projecting region that is exposed to the outside through the through-hole, and
a planar shape of the membrane is octagonal.

4. The pressure sensor according to claim 3, wherein
two of eight sides which define the planar shape of the membrane extend along the lengthwise direction and are defined as first sides,
two of the eight sides which define the planar shape of the membrane extend along the crosswise direction and are defined as second sides,
four of the eight sides which define the planar shape of the membrane are inclined with respect to both the lengthwise direction and the crosswise direction and defined as third sides,
the two first sides are arranged along the crosswise direction,
the two second sides are arranged along the lengthwise direction, and
the first sides and the second sides are linked with each other through the third sides.

5. The pressure sensor according to claim 4, wherein
the piezoelectric element includes a plurality of piezoresistive effect elements,
the plurality of piezoresistive effect elements are provided at respective center parts of the two first sides and the two second sides.

6. The pressure sensor according to claim 5, wherein
the plurality of piezoresistive effect elements are arranged in the membrane such that an electric current flows in the longitudinal direction, the plurality of piezoresistive effect elements, which are provided at respective center parts of the two first sides and the two second sides, constitute two half-bridge circuits, and the two half-bridge circuits constitute a full-bridge circuit.

7. The pressure sensor according to claim 6 further comprising:

a differential amplifier that amplifies a difference between midpoint voltages of the two half-bridge circuits.

8. The pressure sensor according to claim 1 further comprising:

an inner lead that is physically connected to the fixed end through an adhesive, wherein the fixed end, the adhesive, and the inner lead are covered with the resin portion.

\* \* \* \* \*